(12) United States Patent
Okuno

(10) Patent No.: US 8,071,448 B2
(45) Date of Patent: Dec. 6, 2011

(54) SEMICONDUCTOR DEVICE AND MANUFACTURING METHOD OF THE SAME

(75) Inventor: Masaki Okuno, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 178 days.

(21) Appl. No.: 12/543,794

(22) Filed: Aug. 19, 2009

(65) Prior Publication Data
US 2009/0309141 A1 Dec. 17, 2009

Related U.S. Application Data

(63) Continuation of application No. PCT/JP2007/055351, filed on Mar. 16, 2007.

(51) Int. Cl.
*H01L 21/8234* (2006.01)
*H01L 29/78* (2006.01)

(52) U.S. Cl. ........ 438/265; 438/176; 257/900; 257/903; 257/E27.098

(58) Field of Classification Search ............... 438/265; 257/E27.098
See application file for complete search history.

(56) References Cited

U.S. PATENT DOCUMENTS

| 5,146,291 A | 9/1992 | Watabe et al. |
| 5,217,913 A | 6/1993 | Watabe et al. |
| 2001/0017423 A1* | 8/2001 | Roh et al. ............ 257/774 |

FOREIGN PATENT DOCUMENTS

JP 02-065235 A 3/1990

OTHER PUBLICATIONS

M. Kanda et al., "Highly Stable 65 nm Node (CMOS5) 0.56 m m2 SRAM Cell Design for Very Low Operation Voltage", 2003 Symposium on VLSI Technology Digest of Technical Papers, pp. 13-14.
International Search Report of PCT/JP2007/055351, date of mailing Jun. 19, 2007.

\* cited by examiner

*Primary Examiner* — Benjamin Sandvik
*Assistant Examiner* — Joseph Schoenholtz
(74) *Attorney, Agent, or Firm* — Westerman, Hattori, Daniels & Adrian, LLP

(57) ABSTRACT

A disclosed semiconductor device includes multiple gate electrodes disposed on a semiconductor substrate; and multiple sidewall spacers disposed on sidewalls of the gate electrodes. The thickness of the sidewall spacers is larger on the sidewalls along longer sides of the gate electrodes than on the sidewalls along shorter sides of the gate electrodes.

13 Claims, 11 Drawing Sheets

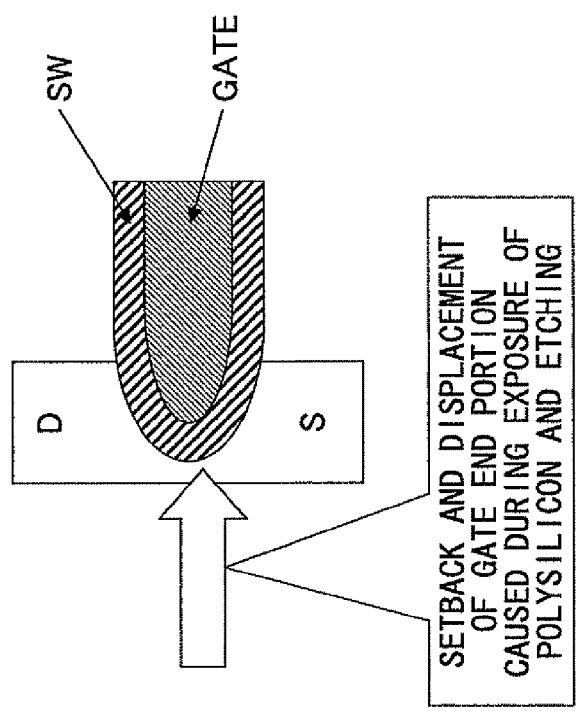
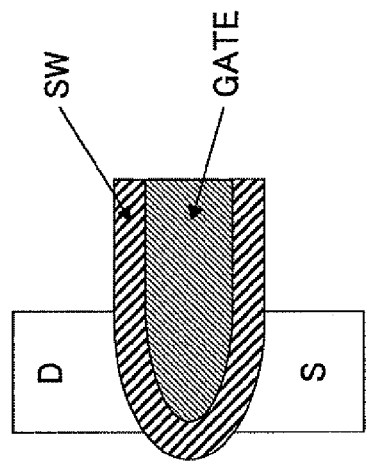
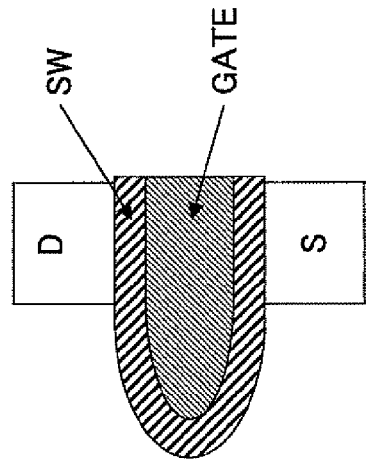

IMPLANTATION CHARACTERISTICS OF SD REGION IMMEDIATELY BELOW GATE END PORTION ARE DIFFERENT

SEMICONDUCTOR DEVICE AND MANUFACTURING METHOD OF THE SAME

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2007/055351, filed on Mar. 16, 2007, the entire contents of which are incorporated herein by reference.

FIELD

The present disclosure is directed to a semiconductor device and a manufacturing method of the same, and in particular to a gate structure of a MOS semiconductor device and a manufacturing method of the same.

BACKGROUND

As illustrated in FIG. 1, SRAMs (static random access memories) are characterized by having gate patterns 15 aligned, in a broken-line manner, perpendicularly to active regions 18. According to the example of FIG. 1, the SRAM has point-symmetric cell structures, and two transfer transistors and two CMOS (complementary metal oxide semiconductors) inverters are provided in each cell 100 symmetrically around a point.

In reducing the size of a SRAM, it becomes a key issue of how much a protruding amount B of each gate pattern 15 from the active region 18 can be reduced, as illustrated in the dashed-line box A. Next is described a current problem with a focus on, for example, driver transistors of the SRAM of FIG. 1.

FIG. 2 is an enlarged view of the region A of FIG. 1, and illustrates the setback position of a gate end portion created in a gate etching process. In general, end portions of gates 25 formed by the gate etching process are located in setback positions in resist patterns (gate patterns) 15. Therefore, the gate protruding amount B needs to be sufficiently provided in advance when the resist patterns are formed, in view of the setback amount of the gate etching. This, in turn, requires providing sufficient spacing "d" between the active regions 18 in view of the setback amount of the gate etching, which prevents a reduction in the size of the SRAM device.

FIG. 3 illustrates a setback of the gate end portion after the gate etching and device failure. In the case where the gate protruding amount B (see FIG. 1) is sufficiently provided, the source and the drain are separated by the gate, as illustrated in FIG. 3A, and therefore, a favorable transistor may be formed. However, if the gate protruding amount is insufficient, the gate end is positioned posteriorly by exposure of polysilicon during the patterning process and the gate etching. As a result, as illustrated in FIGS. 3B and 3C, the gate end portion does not sufficiently overlap the active region (the source and drain). In particular, in the case of FIG. 3C, the source and the drain are not separated by the gate, causing a short circuit, and thus, the device is completely defective. In the case of FIG. 3B, although the source and the drain are separated by the gate and the sidewall, the gate length is different from that of the favorable device (FIG. 3A). Accordingly, there are differences in the device properties, and therefore, the device of FIG. 3B is also determined as defective.

The above description is given with an example of a driver transistor near a cell boundary; however, the same problem may occur for the protruding amounts of the transfer gates within the cells of FIG. 1.

Gate double patterning has recently attracted attention as a technology for preventing setbacks of gate etching end portions and decreasing cell sizes of SRAMs by reducing the space "d" between the active regions 18 of FIG. 2 (For example, see M. Kanda, et al, "Highly Stable 65 nm Node (CMOS5) 0.56 $\mu m^2$ SRAM Cell Design for Very Low Operation Voltage", 2003 Symposium on VLSI Technology Digest of Technical Papers, pp. 13-14). According to the technology, a single long gate pattern connecting adjacent gates is created first, and then etching is performed using a gate-separating mask 20 having an aperture 21 so as to form separated gates, as illustrated in FIGS. 4A through 4C. The technology does not cause setbacks of the gate end portions, and therefore, it is possible to reduce the space "d" between the active regions 18 of FIG. 2.

However, the inventors of the present disclosure have found a problem associated with the gate double patterning of FIGS. 4A through 4C. If the gate 25 is cut at a position very close to the active region (the source and drain region) due to displacement of the gate-separating mask 20 during the exposure process, as illustrated in FIG. 5A, and a device is then created according to general procedures, changes occur in the current characteristics of the gate end portion.

For example, four-way angled implantation is performed in order to form a pocket 26, as illustrated in FIG. 5B, then a sidewall (SW) 27 is formed by extension implantation, and a source-drain region 28 is formed, as illustrated in FIG. 5C. In this case, ion implantation characteristics are different between a region adjacent to the edge along the gate end portion and the remaining region. Therefore, variation is caused in the current characteristics (the arrow b) close to the edge of the gate and the current characteristics (the arrow a) of the inside the gate.

Devices produced in this manner cause property fluctuations, which become a factor of being defective. In order to prevent such property fluctuations, it is necessary to provide a sufficient amount of spacing "d" between the active regions 18 of FIG. 2 in view of a margin of exposure displacement of the gate-separating mask and an implantation margin even in the case of performing the gate double patterning.

SUMMARY

According to one aspect of the present disclosure, a semiconductor device includes (a) multiple gate electrodes disposed over a semiconductor substrate; and (b) multiple sidewall spacers disposed on sidewalls of the gate electrodes. The thickness of the sidewall spacers is larger on the sidewalls along longer sides of the gate electrodes than on the sidewalls along shorter sides of the gate electrodes.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A through 3C illustrate the setback of the gate end portion and device failure;

DESCRIPTION OF EMBODIMENTS

Embodiments that describe the best mode for carrying out the present disclosure are explained next with reference to the drawings. FIGS. 6A through 6D illustrate the basic concept of the present disclosure. The following description is given using an example of the driver transistors in the region A of FIG. 1.

Figure 6A:
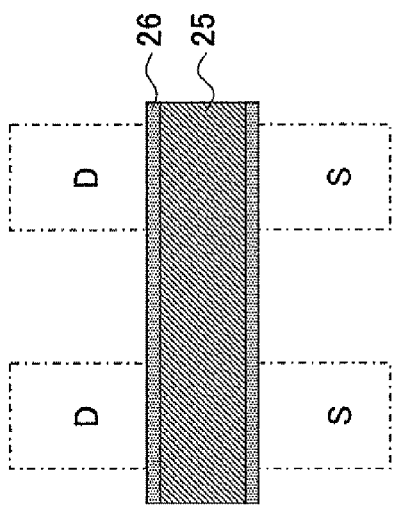
FIGS. 6A through 6D illustrate a basic concept of the present disclosure.
Figure 6B:
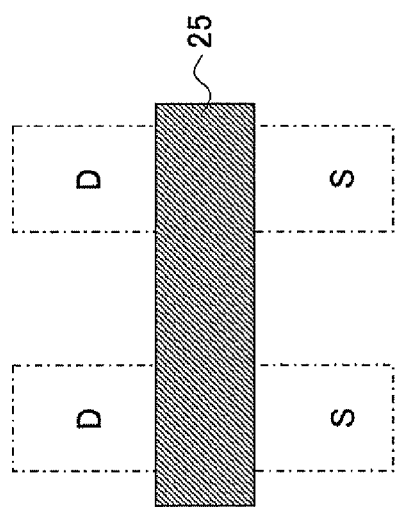
Figure 6C:
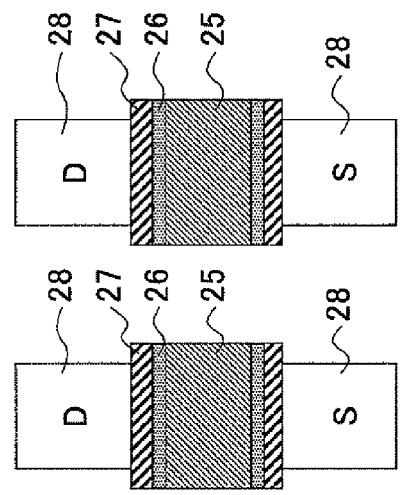

The present disclosure is directed to achieving a further size reduction compared to the conventional double patterning. First, unlike the conventional method, etching of the gate electrode 25 is performed based on a straight and continuous gate pattern, as illustrated in FIG. 6A. Then, pocket implantation is performed, as the gate electrode 25 still remains continuous, so as to form pocket regions 26, as illustrated in FIG. 6B. Next, extension implantation is performed, as the gate electrode 25 still remains continuous, so as to form sidewall spacers (hereinafter, simply referred to as "sidewalls" or "SWs") 27, and source/drain implantation is performed to form source/drain regions 28, as illustrated in FIG. 6C. Lastly, after impurity implantation is completed, the gate is cut and divided to form gate electrodes in designed shapes.

According to this method, since the gate electrode 25 and the sidewalls 27 are cut and divided at the end, impurities are not implanted into a part of the substrate region from which the gate pattern has been removed. Therefore, the impurity characteristics immediately below the gate electrode end portions never become asymmetrical, which results in stable operating characteristics.

Figure 2:
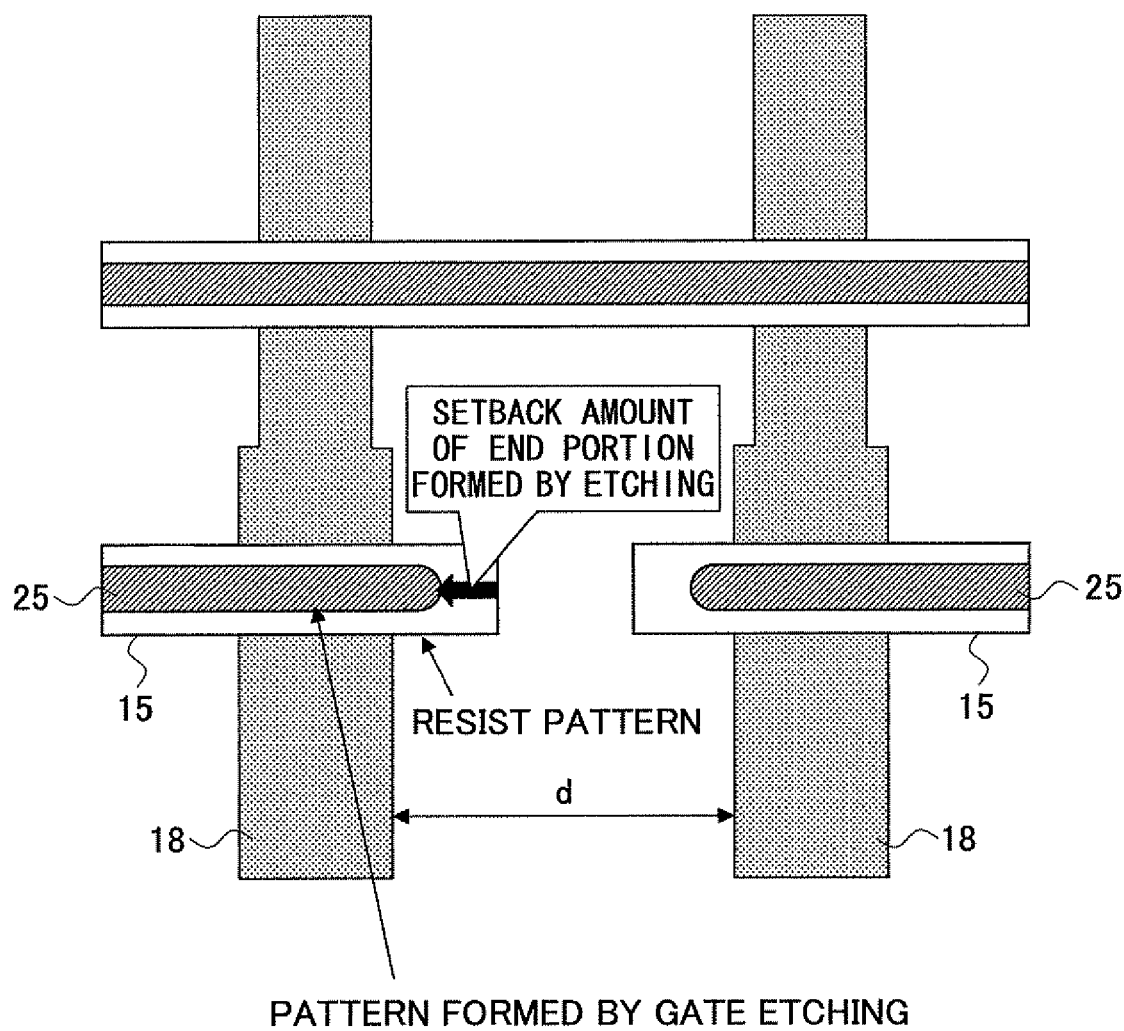
FIG. 2 illustrates a setback of a gate end portion formed by etching.
Figure 6D:
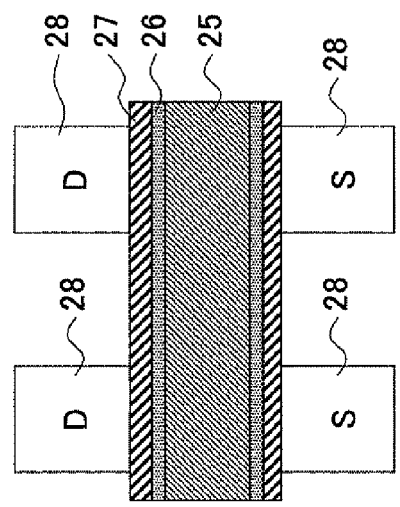

Unlike the conventional method, the sidewalls 27 are provided only in the longitudinal direction of the gate (i.e. along the gate length direction) since the gate is cut and divided at the end, and are therefore absent from the intervening region between two opposing driver transistors (FIG. 6D). This allows the space "d" between the active regions 18 of FIG. 2 to be reduced, thus contributing to the size reduction of the cell structure.

Figure 1:
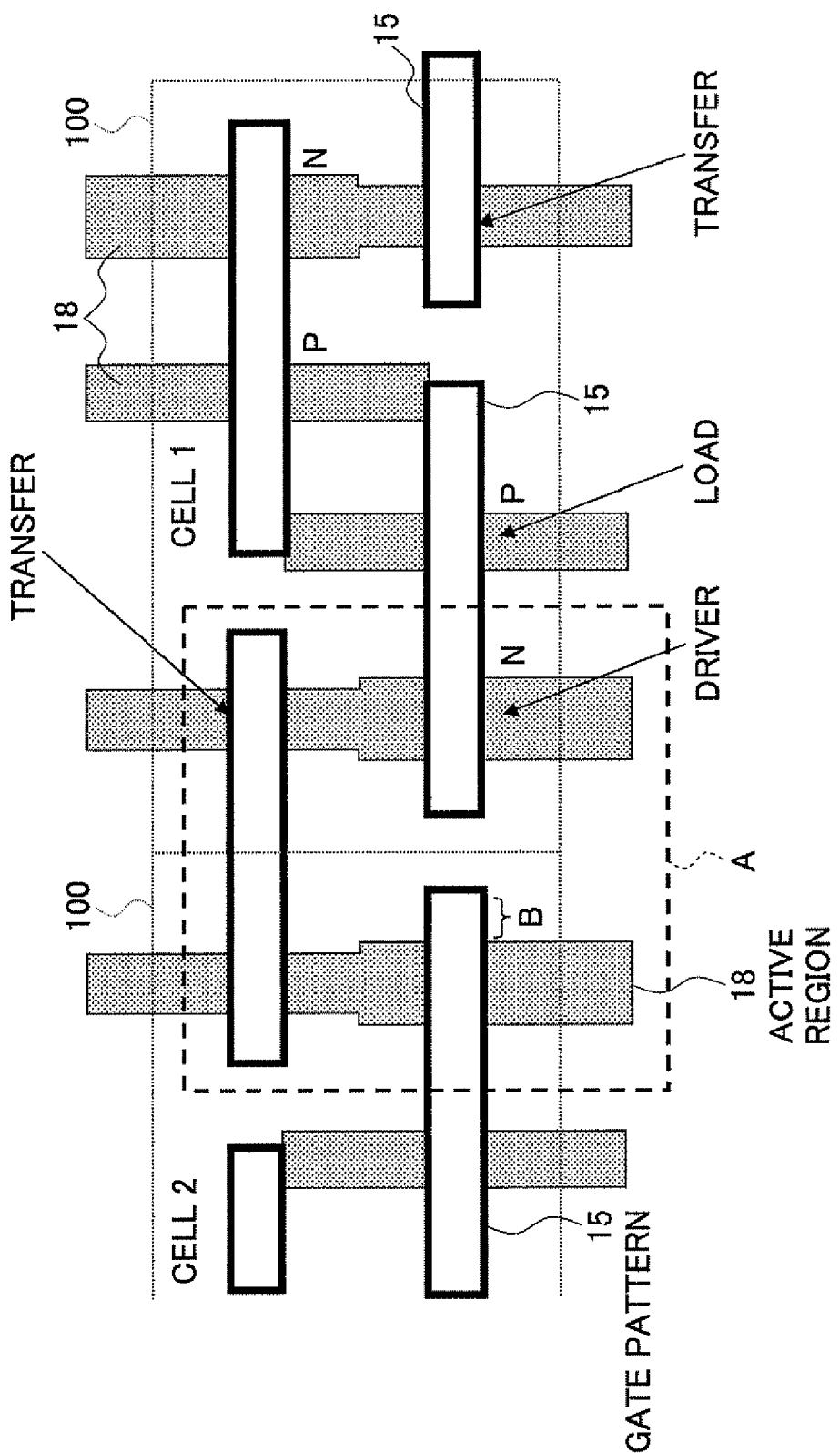
FIG. 1 shows a mask arrangement of gate electrodes and active regions in a general SRAM.

These structural and manufacturing features can also be applied to the structures and manufacturing methods of the transfer gates and load gates in the cells of FIG. 1.

FIGS. 7A through 7F show manufacturing processes of the semiconductor device according to one embodiment of the present disclosure. The following description is also given using an example of the neighboring driver transistors adjacent to the cell boundary in the SRAM, as illustrated in the region A of FIG. 1.

Figure 7A:
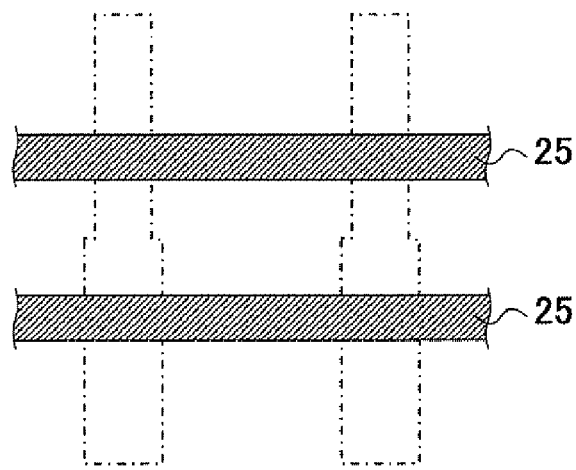
FIGS. 7A through 7F show manufacturing processes of a semiconductor device according to one embodiment of the present disclosure.

First, as illustrated in FIG. 7A, active regions of the SRAM are defined by forming an element separating region (not shown), such as STI (shallow trench isolation), on a silicon substrate. Then, the following processes are performed: well implantation; channel implantation; activation annealing; deposition of a gate oxide film; and deposition of a polysilicon film. The processes up to this point are performed according to the conventional method. In the case of SRAM cells of FIG. 1, wells are formed in such a manner that a P well, an N well and a P well are aligned within one cell.

Next, according to the conventional method, gate patterning is performed according to the SRAM gate patterns, using a mask with dashed and separated lines, as illustrated in FIG. 1. On the other hand, according to the embodiment of the present disclosure, straight and continuous patterns of the gate electrodes 25 are created, as illustrated in FIG. 7A. Note that, in the example of FIG. 7A, the upper gate electrode 25 is cut in a post process so as to function as transfer gates, and the lower gate electrode 25 is cut in the post process so as to function as driver gates.

Figure 7B:
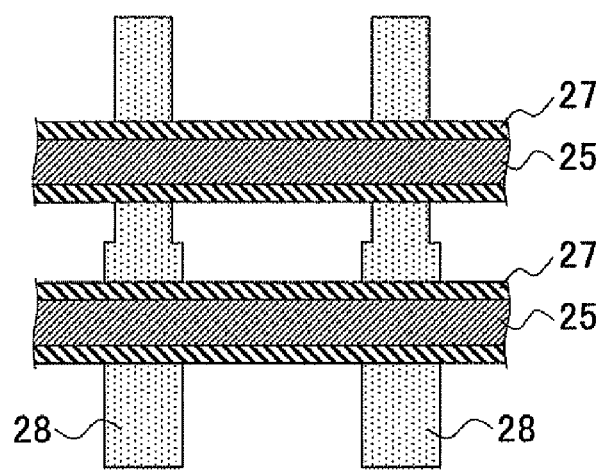

Next, as illustrated in FIG. 7B, pocket implantation and extension implantation are performed, as in the case of the conventional method, so as to dispose the sidewalls 27 formed, for example, of a CVD oxide film having a thickness of 30 to 80 nm. Then, source/drain implantation is performed to form the source/drain regions 28.

Figure 7C:
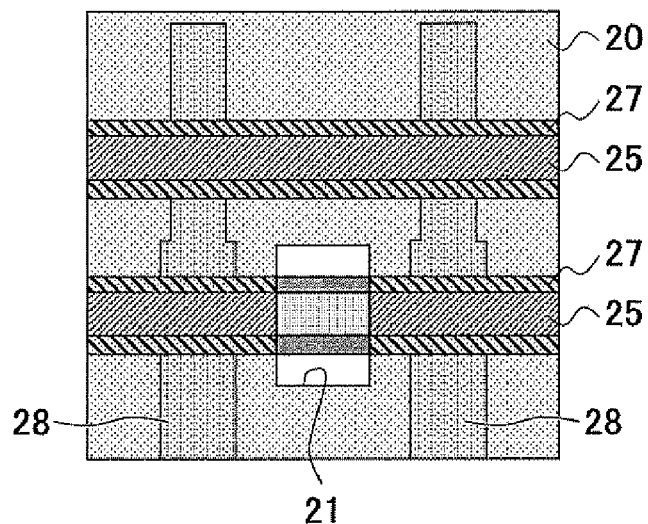

Next, as illustrated in FIG. 7C, a resist (not shown) is applied to the entire surface, and using the mask 20 having a predetermined opening 21, only a gate cut portion is exposed and etching is then performed. For the etching process, RIE (reactive ion etching) may be employed using a mixed gas including HBr and oxygen under the conditions of a pressure of between 1 and 100 Pa and a frequency of 13.56 MHz. In addition, for example, a CVD nitride film having a thickness of 10 to 40 nm may be deposited as an etching hard mask before the application of the resist.

Figure 7D:
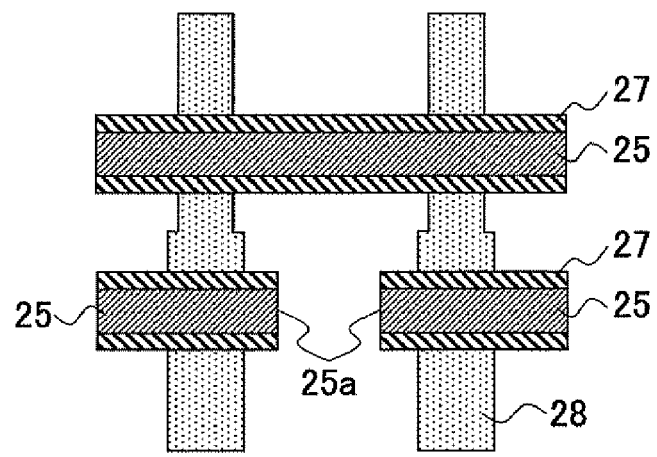

Next, as illustrated in FIG. 7D, the resist is removed so as to obtain gate structures cut and separated in predetermined shapes. In the case where a hard mask is used in the process of FIG. 7C, the CVD nitride film is removed by phosphoric acid after the removal of the resist. At this point, the basic structure according to one embodiment of the present disclosure is completed. Note however that, depending on conditions of a subsequent silicide process, silicide may eat away in the lateral direction (gate width direction) from cut gate edges 25a. In that case, the silicide corrosion from the gate edges 25a can be prevented by carrying out the following processes.

Figure 7E:
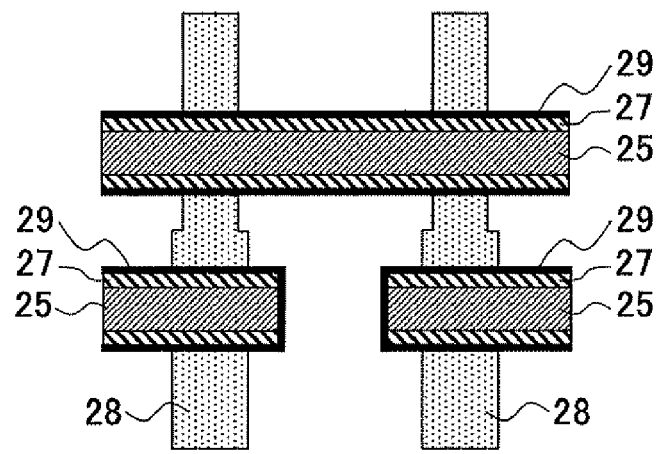

That is, as illustrated in FIG. 7E, after the separation of the gate electrodes 25, thin sidewalls 29 having a width of about 5 to 20 nm are formed using a CVD oxide film. The thin sidewalls 29 cover the gate edges 25a of the gate electrodes 25 exposed after the cut and separation process.

Figure 7F:
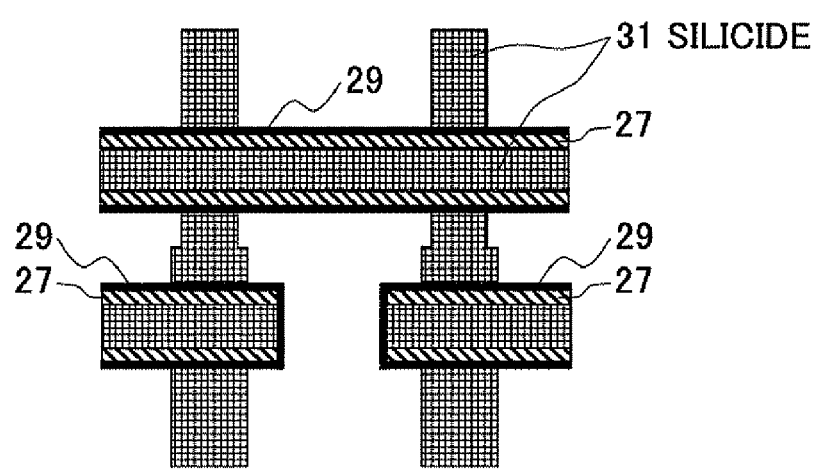

Lastly, as illustrated in FIG. 7F, a silicide process is performed. A silicide metal, such as Ni or Co, is sputtered in a thickness of 2 to 30 nm, and first annealing is performed at a temperature of 200 to 600° C. Unreacted metal is removed by an acid solution, and then second annealing is performed at a temperature of 300 to 900° C. NiSi (nickel silicide) or CoSi (cobalt silicide) is disposed over the gate electrodes 25 and the source/drain regions 28.

Figure 8:
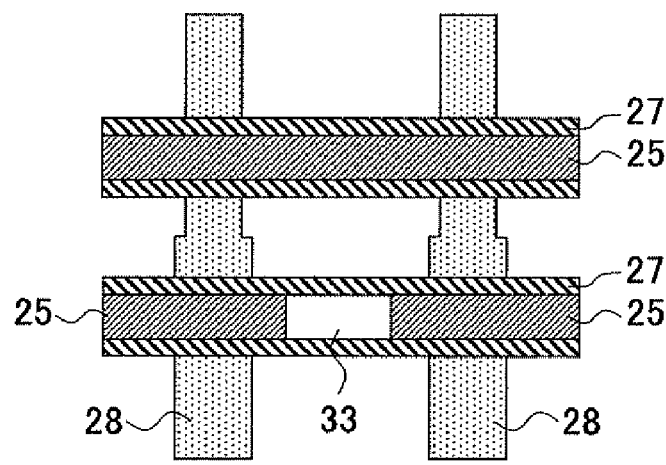
FIG. 8 shows a modification of the semiconductor device of the present disclosure.
Figure 9:
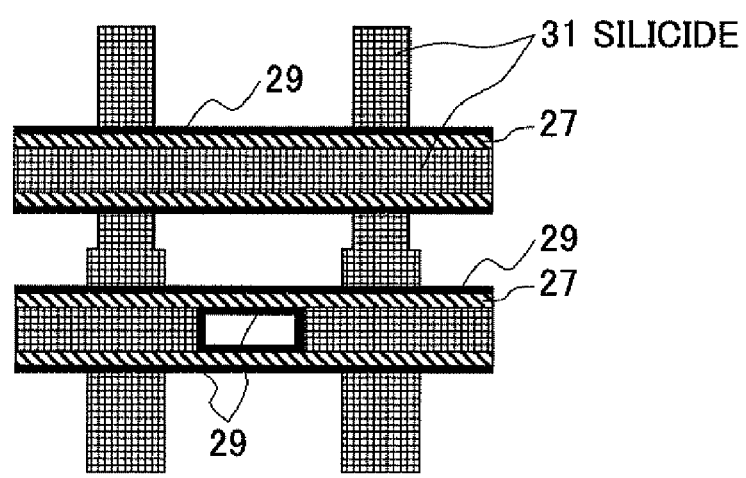
FIG. 9 shows another modification of the semiconductor device of the present disclosure.

FIGS. 8 and 9 show modifications of the gate structure of the present disclosure. With reference to FIG. 8, only the gate electrode 25 is cut by a cut portion 33 while the sidewalls 27 are not cut and remain continuous. This structure is achieved by controlling etching conditions of the gate cut portion and the film quality of the sidewalls 27 during the process of FIG. 7C. A device having such a structure is effective since transistors operate properly if the neighboring gate electrodes 25 are electrically insulated by the cut portion 33.

Furthermore, in order to prevent silicide diffusion in the lateral direction of the gates, the thin sidewalls 29 are formed to cover the gate edge faces, as illustrated in FIG. 9, after the formation of the structure illustrated in FIG. 8. Subsequently, the silicide process is carried out.

In either structure of FIG. 8 or FIG. 9, the sidewalls along the longer sides of the gate electrodes 25 (in the gate length direction) are thicker than those along the shorter sides (in the gate width direction).

Figure 4C:
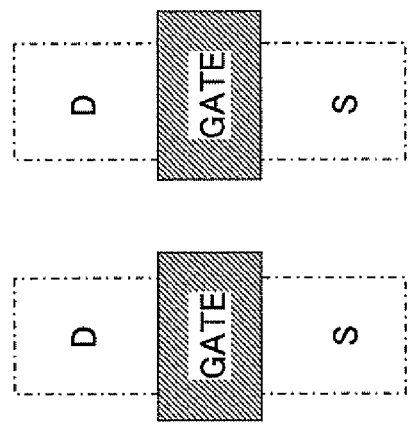
FIGS. 4A through 4C show a publicly known method of gate-electrode double patterning.
Figure 4B:
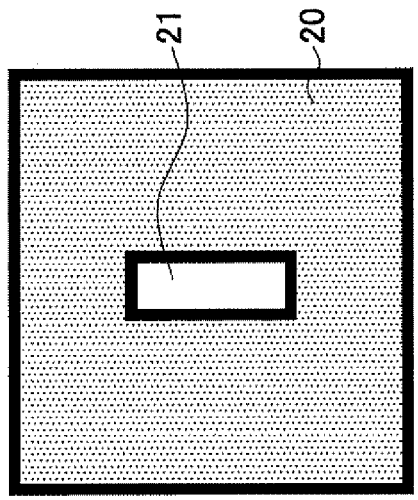
Figure 4A:
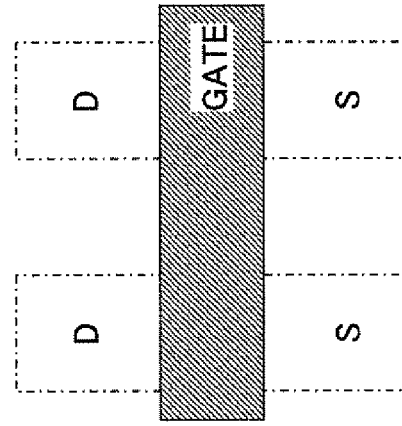
Figure 5A:
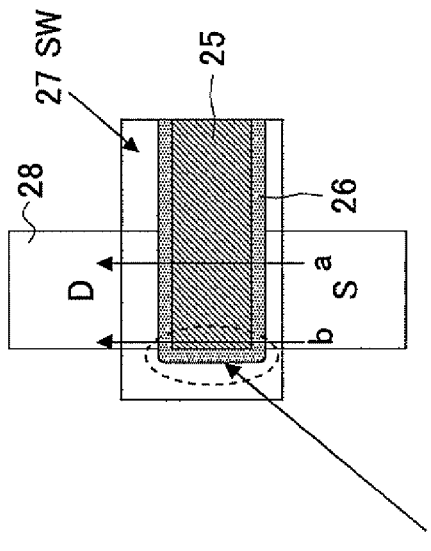
FIGS. 5A through 5C illustrate problems associated with the conventional gate-electrode double patterning.
Figure 5B:
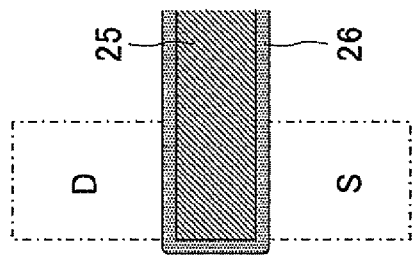
Figure 5C:
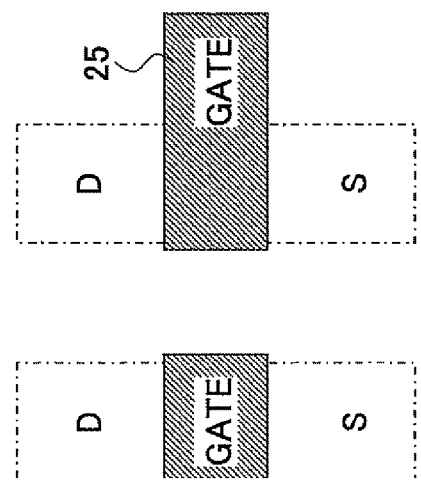
Figure 10:
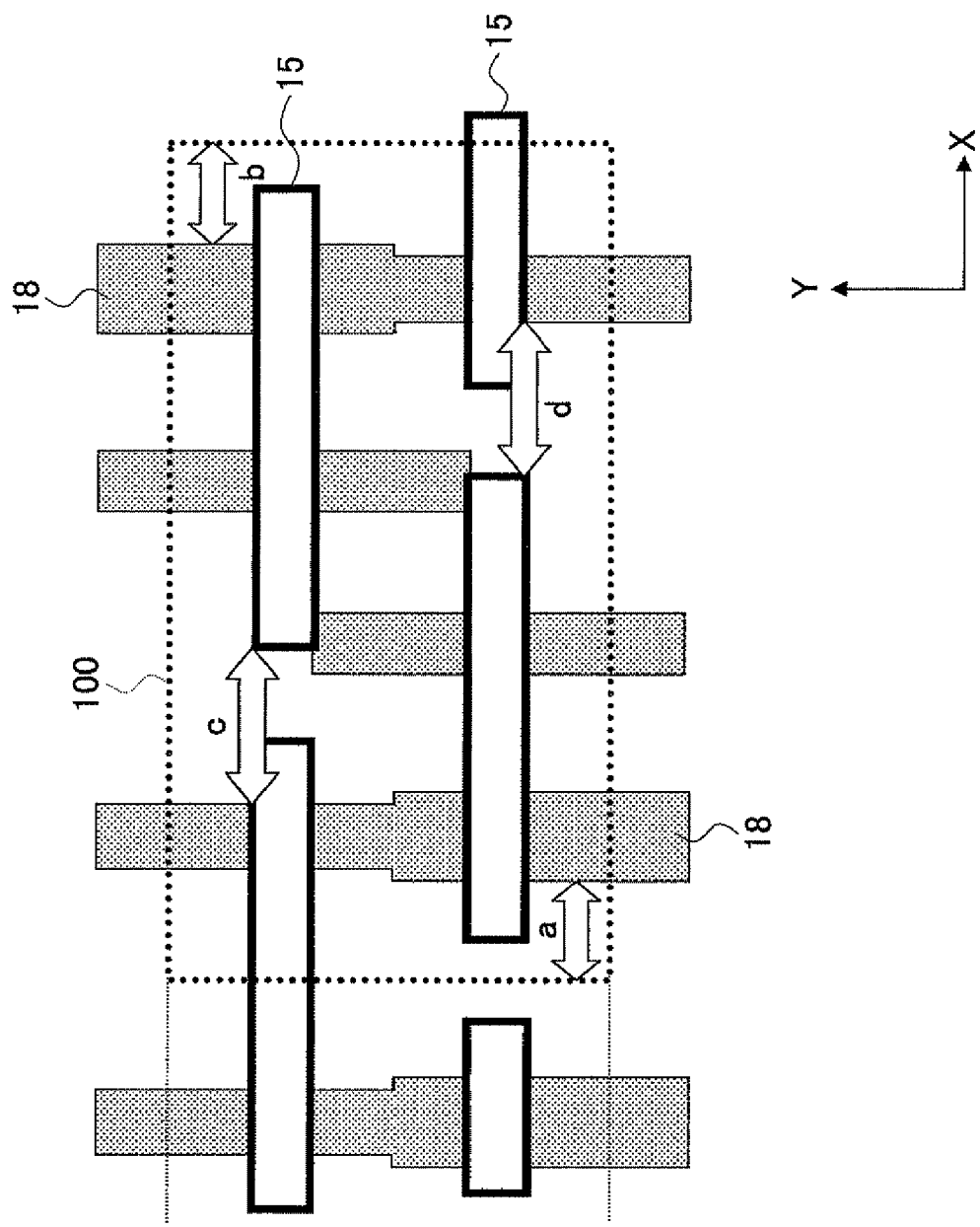
FIG. 10 illustrates advantageous effects of the present disclosure.

FIG. 10 illustrates effects of the size reduction according to the embodiment of the present disclosure. According to the conventional double patterning method illustrated in FIGS. 4 and 5, in order to produce a stable device, the protruding amount obtained after the gate etching process requires a margin of 10 nm in addition to the margin of exposure displacement if the extending width of the pocket implantation and the extension implantation, in which the gate electrodes are used as a mask, is estimated as about 10 nm. On the other hand, according to the present disclosure, since the extending width of the pocket implantation and the extension implantation from the gate edges 25a is absent, the protruding amount obtained after the gate etching process can be reduced by 10 nm in order to produce a device having the same performance as that produced by the conventional method.

Effects obtained in the case of applying the structure of the embodiment of the present disclosure to a 45 nm node SRAM cell are estimated as follows. Assume that, for example, a cell having dimensions of 760 nm in the X direction and 340 nm in the Y direction (an area of 0.2584 $\mu m^2$) is produced using the gate double patterning method. In this case, if the structure according to the embodiment of the present disclosure is applied, individual dimensions a, b, c and d of FIG. 10 can be reduced by 10 nm. As a result, the cell dimensions are 720 nm in the X direction and 340 nm in the Y direction, and the area is reduced by about 5% to 0.2584 $\mu m^2$.

In the case of a 32 nm node SRAM cell, while a cell of the conventional structure has dimensions of 530 nm in the X direction and 240 nm in the Y direction with an area of 0.1272 $\mu m^2$, a cell to which the embodiment of the present disclosure is applied has dimensions of 490 nm in the X direction and 240 nm in the Y direction with an area of 0.1176 $\mu m^2$, allowing an 8% reduction in the area.

In conclusion, according to the above-described structure and method, it is possible to reduce the distance between the active regions while preventing variations in the impurity characteristics in the substrate region immediately below the gate end.

As a result, a reduction in the size of the cell structure of the semiconductor device is achieved, and stable operation is also ensured.

Thus, the present disclosure has been described based on the preferred embodiment; however, it should be understood that the present invention is not limited to the particular embodiment and various changes and modification may be made to the particular embodiment without departing from the scope of the present invention as defined in the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present disclosure has been described in detail, it should be understood that various changes, substitutions, and alterations could be made hereto without departing from the spirit and scope of the invention.

What is claimed is:

1. A method for manufacturing a semiconductor device comprising:
    forming a gate electrode material film over a semiconductor substrate;
    performing patterning on the gate electrode material film to form a linear pattern;
    forming first sidewall spacers along longer sides of the linear pattern; and
    cutting the linear pattern along a shorter side of the linear pattern at one or more predetermined positions so as to form a plurality of gate electrodes.

2. The method as claimed in claim 1, further comprising implanting an impurity into the semiconductor substrate to form a source and drain region after the formation of the first sidewall spacers and before the formation of the gate electrodes.

3. The method as claimed in claim 1, wherein in the formation of the gate electrodes, both the linear pattern and the first sidewall spacers are cut.

4. The semiconductor device manufacturing method as claimed in claim 2, wherein in the formation of the gate electrodes, both the linear pattern and the first sidewall spacers are cut.

5. The method as claimed in claim 1, wherein in the formation of the gate electrodes, the first sidewall spacers are left continuous and the linear pattern is cut.

6. The method as claimed in claim 2, wherein in the formation of the gate electrodes, the first sidewall spacers are left continuous and the linear pattern is cut.

7. The method as claimed in claim 1, further comprising forming a pocket region and/or an extension region along the longer sides of the linear pattern before the formation of the first sidewall spacers.

8. The method as claimed in claim 1, further comprising forming second sidewall spacers along the longer sides and shorter sides of the gate electrodes, thickness of each of the second sidewall spacers being smaller than thickness of each of the first sidewall spacers.

9. The method as claimed in claim 8, wherein the thickness of each of the second sidewall spacers is between 5 nm and 20 nm.

10. The method as claimed in claim 8, further comprising performing a silicide process so as to form a metal silicide over the gate electrodes and the source and drain region after the formation of the second sidewall spacers.

11. The method as claimed in claim 9, further comprising performing a silicide process so as to form a metal silicide over the gate electrodes and the source and drain region after the formation of the second sidewall spacers.

12. The method as claimed in claim 1, wherein the semiconductor device is a static random access memory.

13. The method as claimed in claim 1, wherein the thickness of each of the first sidewall spacers is between 30 nm and 80 nm.

* * * * *